United States Patent
Kuehlwein et al.

(10) Patent No.: US 8,014,098 B1
(45) Date of Patent: Sep. 6, 2011

(54) TECHNIQUE FOR DUTY CYCLE SHIFT IN HARD DISK DRIVE WRITE SYSTEM

(75) Inventors: Jeremy Robert Kuehlwein, Woodbury, MN (US); Craig Matthew Brannon, Maplewood, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/843,669

(22) Filed: Jul. 26, 2010

(51) Int. Cl.
*G11B 5/02* (2006.01)
(52) U.S. Cl. ........................................................ 360/68
(58) Field of Classification Search .................... 360/68, 360/67, 46, 75; 330/260, 304; 323/268, 323/282; 327/58, 175
See application file for complete search history.

(56) References Cited

U.S. PATENT DOCUMENTS

| | | | | | |
|---|---|---|---|---|---|
| 4,293,823 | A | * | 10/1981 | Hochberg et al. | 330/260 |
| 4,603,299 | A | * | 7/1986 | Monett | 327/58 |
| 5,629,608 | A | * | 5/1997 | Budelman | 323/268 |
| 5,699,343 | A | * | 12/1997 | Moritsugu et al. | 369/124.14 |
| 6,344,778 | B1 | * | 2/2002 | Nakamura et al. | 331/34 |
| 6,473,253 | B1 | * | 10/2002 | Bhandari et al. | 360/46 |
| 6,567,228 | B1 | * | 5/2003 | Bhandari et al. | 360/67 |
| 6,838,943 | B2 | * | 1/2005 | Zamir et al. | 330/304 |
| 7,501,870 | B2 | * | 3/2009 | Choi et al. | 327/175 |
| 2006/0091869 | A1 | * | 5/2006 | Zhang | 323/282 |
| 2010/0102789 | A1 | * | 4/2010 | Randall | 323/282 |

* cited by examiner

*Primary Examiner* — Fred Tzeng
(74) *Attorney, Agent, or Firm* — Dawn V. Stephens; Wade James Brady, III; Frederick J. Telecky, Jr.

(57) ABSTRACT

A circuit for providing a write current having a programmably adjustable duty cycle in a hard disk drive write channel has a differential pair gain circuit for receiving a data input signal and generating a differential output voltage to provide a differential write signal for generating the write current. First and second programmable current sources are connected to the differential pair gain circuit to create a programmable voltage offset of the differential output voltage to programmably adjust the duty cycle of the write current.

20 Claims, 6 Drawing Sheets

TECHNIQUE FOR DUTY CYCLE SHIFT IN HARD DISK DRIVE WRITE SYSTEM

BACKGROUND

1. Field

This various circuit embodiments described herein relate in general to improvements in hard disk drive write systems, and, more specifically, to improvements in systems, methods, and apparatuses for shifting a duty cycle of a write signal in hard disk drive write systems.

2. Background

Hard disk drives are mass storage devices that include a magnetic storage media, such as rotating disks, platters, or the like, a channel chip, a preamp chip, one or more positionable write heads, an interconnect between the channel and preamp chips, and an interconnect between the preamp chip and write head. The conventional write heads comprise magneto-resistive heads adapted to write data to the magnetic storage media when current is passed through them. The signal path for the writing process in a hard disk drive system includes all of these components.

When data is written to the disk, electrical current pulses are applied to the write heads according to coding rules to produce a magnet flux change in the write heads that is applied to the magnetic storage medium. However, the transition between a positive write data pulse and a negative write data pulse can systematically shift in either direction due to any of the components in the signal path, especially in the channel chip and the long interconnect between the channel and preamp chips.

What is needed is a mechanism to compensate for this systematic shift in the transition between positive and negative write data pulses. This compensation can be considered to be a duty cycle shift for the write data.

SUMMARY

According to a broad embodiment of the invention, a circuit is presented for providing a write current having a programmably adjustable duty cycle in a hard disk drive write channel. The circuit includes a differential pair gain circuit for receiving a data input signal and generating a differential output voltage to provide a differential write signal for generating the write current and first and second programmable current sources connected to the differential pair gain circuit to create a programmable voltage offset of the differential output voltage. The programmable voltage offset of the differential output voltage programmably adjusts the duty cycle of the write current.

According to another broad embodiment of the invention, a circuit is presented for providing a write current having a programmably adjustable duty cycle in a hard disk drive write channel. The circuit includes an input differential pair gain circuit for receiving a data input signal and producing an input circuit differential output voltage and a differential pair emitter follower circuit receiving the input circuit differential output voltage and providing an emitter follower circuit differential output voltage. An output differential pair gain circuit receives the emitter follower circuit differential output voltage and produces an output circuit differential output voltage for generating write head currents. First and second programmable current sources are connected to the input differential pair gain circuit to create a voltage offset of the input circuit differential output voltage.

According to still another embodiment, a write data signal circuit for a hard disk drive write head is presented. The circuit includes an output gain stage, comprising a first differential pair of bipolar junction transistors to provide write currents to the write head and an emitter follower stage, comprising a second differential pair of bipolar junction transistors for providing drive signals to the output gain stage. An input gain stage is provided, comprising a third differential pair of bipolar junction transistors and resistive loads for the third differential pair of bipolar junction transistors for providing drive signals to the emitter follower stage. First and second programmable current sources are respectively connected between the third differential pair of bipolar junction transistors the resistive loads whereby changes in current supplied by the first and second programmable current sources changes a duty cycle of the write currents supplied to the write head.

BRIEF DESCRIPTION OF THE DRAWINGS

An embodiment of the present invention is illustrated in the accompanying drawings, in which.

In the various figures of the drawing, like reference numbers are used to denote like or similar parts, features, or elements.

DETAILED DESCRIPTION

Figure 1:
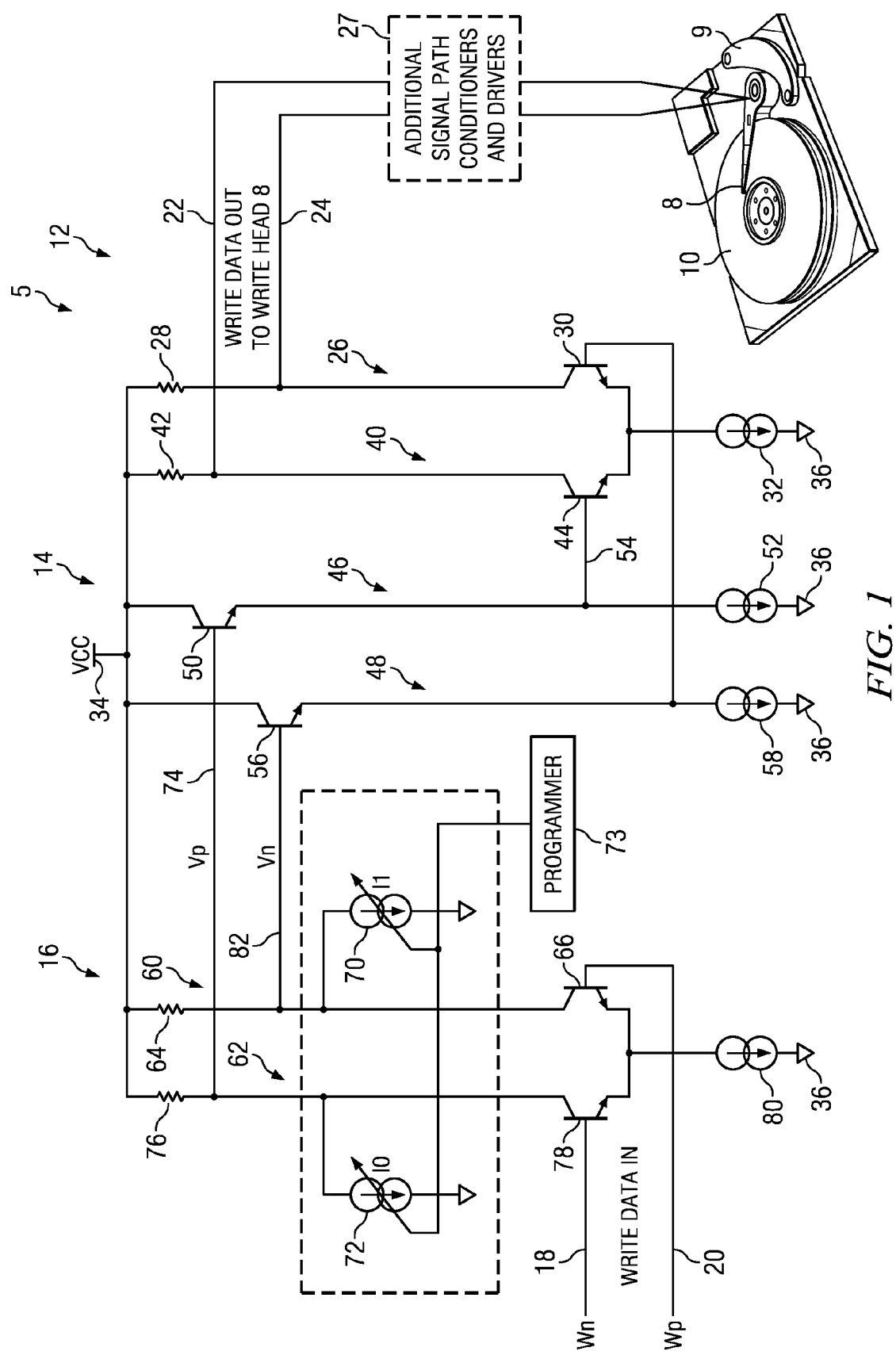
FIG. 1 is a simplified electrical schematic diagram of a portion of a preamplifier write data signal circuit.

A simplified electrical schematic diagram of an embodiment of a preamplifier write data signal circuit 5 in the write data signal path is shown in FIG. 1 to which reference is now made. The preamplifier write data signal circuit 5 provides write currents to the write head 8 of a hard disk drive 9 having one or more rotating disks 10 having magnetic media to which data may be written or from which the data may be read. Although only one write head 8 is shown, it is understood that a plurality of write heads may be employed.

The write data signal circuit 5 includes an output gain stage 12, an emitter follower stage 14, and an input gain stage 16, with the write data-in signal applied to the input gain stage 16 on input lines 18 and 20, and the write data-out signal applied to the write head 8 on output lines 22 and 24.

The output gain stage 12 includes a first current path 26 to supply write head current in one direction through additional signal path conditioners and drivers 27 to the write head 8. The first current path 26 has a first resistor 28, a first bipolar transistor 30, and a first current source 32 connected in series between a supply voltage 34 and a reference potential, or ground, 36. A first side of the write head 8 on output line 22 is connected through the additional signal path conditioners and drivers 27 to the collector of the first bipolar transistor 30. (It should be noted that the embodiment illustrated herein is shown with NPN bipolar junction transistors; however, those skilled in the art will appreciate that the principles of the invention can be equally advantageously realized with other transistor types, including PNP bipolar junction transistors, and the like, with appropriate circuit arrangement.)

The output gain stage 12 also includes a second current path 40 to supply write head current in another direction through the additional signal path conditioners and drivers 27 to the write head 8. The second current path 40 has a second resistor 42, a second bipolar transistor 44, and the first current source 32 connected in series between the supply voltage 34 and the reference potential, or ground, 36. A second side of the write head 8 on output line 24 is connected through the additional signal path conditioners and drivers 27 to the collector of the second bipolar transistor 44.

The emitter follower stage 14 provides drive signals to the first and second bipolar switches transistors 30 and 44, and has a third current path 46 and a fourth current path 48. The third current path 46 has a third bipolar transistor 50 and a second current source 52 connected in series between the supply voltage 34 and the reference potential 36. One differential output of the emitter follower stage 14 is connected between the emitter of the third bipolar transistor 50 and a base of the second bipolar transistor 44 on output line 54.

The fourth current path 48 has a fourth bipolar transistor 56 and a third current source 58 connected in series between the supply voltage 34 and the reference potential 36. The other differential output of the emitter follower stage 14 is connected between the emitter of the fourth bipolar transistor 56 and the base of the first bipolar transistor 30.

The input gain stage 16 has a fifth current path 60 and a sixth current path 62. The fifth current path 60 has a fifth resistor 64, a fifth bipolar transistor 66, and a fourth current source 68 connected in series between the supply voltage 34 and the reference potential 36. One side of the differential data write input signal on input line 20 is connected to the base of the fifth bipolar transistor 66 to deliver the input signal Wp thereto. One output line 74 of the differential output voltage from the input gain stage 16 is connected between the collector of the fifth bipolar transistor 66 and the base of the fourth bipolar transistor 56 providing voltage Vp thereon.

The sixth current path 62 has a sixth resistor 76, a sixth bipolar transistor 78, and a fifth current source 80 connected in series between the supply voltage 34 and the reference potential 36. One side of the differential data write input signal on input line 18 is connected to the base of the sixth bipolar transistor 78 to deliver the input signal Wn thereto. The other output line 82 of the differential output voltage from the input gain stage 16 is connected between the collector of the sixth bipolar transistor 78 and the base of the third bipolar transistor 50.

In addition, a first programmable current source 70 is connected between the collector of the fifth bipolar transistor and the reference potential 36, and a second programmable current source 72 is connected between the collector of the fifth bipolar transistor and the reference potential 36. The first and second programmable current sources 70 and 72 are controlled by a programmer 73 to programmably modify the differential output voltage from the input gain stage 16 to programmably modify the differential output voltage Vp−Vn. The modification of the differential output voltage Vp−Vn, therefor, programmably changes the duty cycle of the write currents supplied to the write head 8.

More particularly, the differential input write data signal on input lines 18 and 20 goes through the input gain stage 16, a differential pair with resistor loading, then the emitter follower stage 14, and then the output gain stage 12. The write data is a digital signal throughout this entire circuit; therefore, all differential pairs are fully switched in a given settled state.

When either programmable current source 70 or 72 is on, providing respective currents I0 and I1, the current source that is on creates a voltage offset of the differential output voltage Vp−Vn from the input gain stage 16. In one direction of the digital write data signal, this voltage offset increases the differential voltage Vp−Vn. In the other direction, the voltage offset decreases the differential voltage Vp−Vn. Given finite risetimes, this skews the time at which the single-ended voltages Vp and Vn cross during a write data polarity transition (Wp>Wn↔Wn>Wp) and shifts the duty cycle, shown in FIG. 2 to which reference is now additionally made.

Figure 2A:
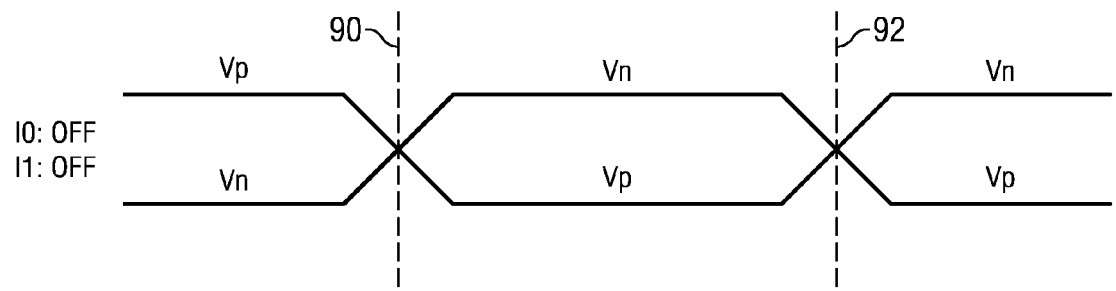
FIGS. 2a-c are graphs of voltage vs. time of the Vp and Vn nodes of the circuit of FIG. 1 with normal, increased, and decreased duty cycles.

FIG. 2 is a graph of voltage vs. time of the Vp and Vn nodes of the circuit of FIG. 1. FIG. 2a shows Vp and Vn when the currents I0 and I1 from both of the programmable current sources 70 and 72 are off. In this case, the differential voltage Vp−Vn=Vp−Vn=$I_{80}$*R where R=$R_{64}$=$R_{76}$ (the subscript numbers identifying the corresponding elements in the drawings). No duty cycle shift occurs, and the zero crossings of voltages Vp and Vn occur at a baseline time, indicated by lines 90 and 92.

Figure 2B:
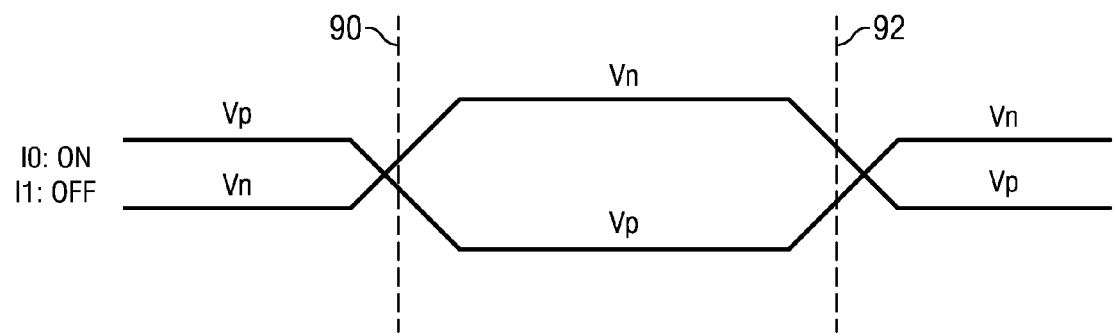

In FIG. 2b, programmable current source 72 is on, providing current I0. This shifts the single-ended voltage Vp down with respect to Vn regardless of the polarity of the write data. The amount of the voltage shift is equal to I0*R. When Wp>Wn, the differential voltage Vp−Vn=($I_{80}$−I0)*R, which is smaller than the differential voltage shown in FIG. 2a. This causes the zero crossings of single-ended voltages Vp and Vn when the write data polarity changes to Wn>Wp to cross to the left of line 90, earlier than in FIG. 2a.

When Wn>Wp, the differential voltage Vn−Vp=($I_{80}$+I0)*R, which is larger than in FIG. 2a. This causes the zero crossings of the single-ended voltages Vp and Vn when the write data polarity changes to Wp>Wn to cross to the right of line 92, later than in FIG. 2a. The overall effect is the increase in percent duty cycle of write data polarity Wn>Wp and the decrease in percent duty cycle of write data polarity Wp>Wn.

Figure 2C:
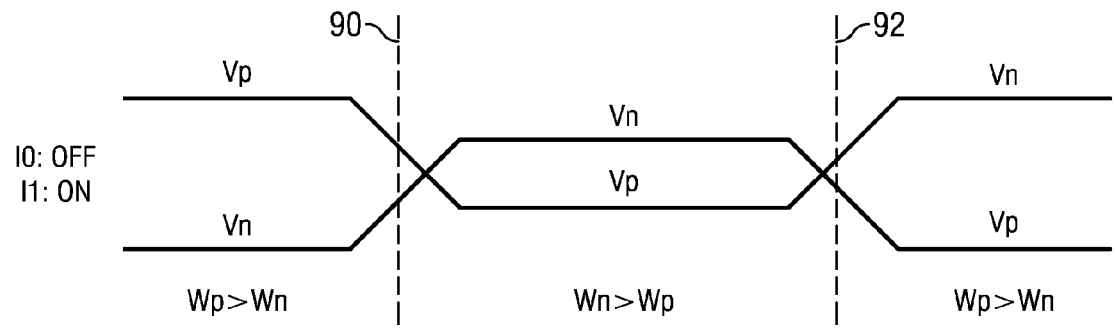

In FIG. 2c, the programmable current source 70 is on, providing current I1. This shifts the single-ended voltage Vn down with respect to Vp regardless of the polarity of the write data. The amount of the voltage shift is equal to I1*R. When Wp>Wn, the differential voltage Vp−Vn=($I_{80}$+I1)*R, which is larger than in FIG. 2a. This causes the zero crossings of the single-ended voltages Vp and Vn when the write data polarity changes to Wn>Wp to cross to the right of line 90, later than in FIG. 2a.

When Wn>Wp, the differential voltage Vn−Vp=($I_{80}$−I1)*R, which is smaller than in FIG. 2a. This causes the zero crossings of the single-ended voltages Vp and Vn when the write data polarity changes to Wp>Wn to cross to the left of lien 90, earlier than in FIG. 2a. The overall effect is the increase in percent duty cycle of write data polarity Wp>Wn and the decrease in percent duty cycle of write data polarity Wn>Wp.

It should be noted that the smallest differential voltage ($I_{80}$−I0)*R or ($I_{80}$−I1)*R is made large enough to fully switch the output gain stage 12 in FIG. 1 under all conditions. Additionally, in the input gain stage 16 in FIG. 1 and all stages thereafter, the differential voltage will always be the same in both write data polarities.

One embodiment by which the programmable current sources 70 and 72 may be programmed to provide three bits of programmability for the duty cycle shift, for example, by an on-chip serial interface. Thus, one possible implementation of the programmer 73 is to use the MSB of a serial interface chip, typically a sign bit, to determine whether programmable current source 70 or 72 is on, and to use the two 2 LSB's, typically were magnitude bits, as a simple binary weighted DAC to weight the currents of the programmable current sources 70 and 72. Of course, any number of bits can be used and can be weighted in any desired fashion. Furthermore, the type of current used for programmable current source 70 or 72 is arbitrary. For example, a CTAT current may be selected for programmable current source 70 or 72 to achieve the best performance over corners (offset voltage created to track Vbe of the bipolar differential pair of the next gain stage).

Figure 3:
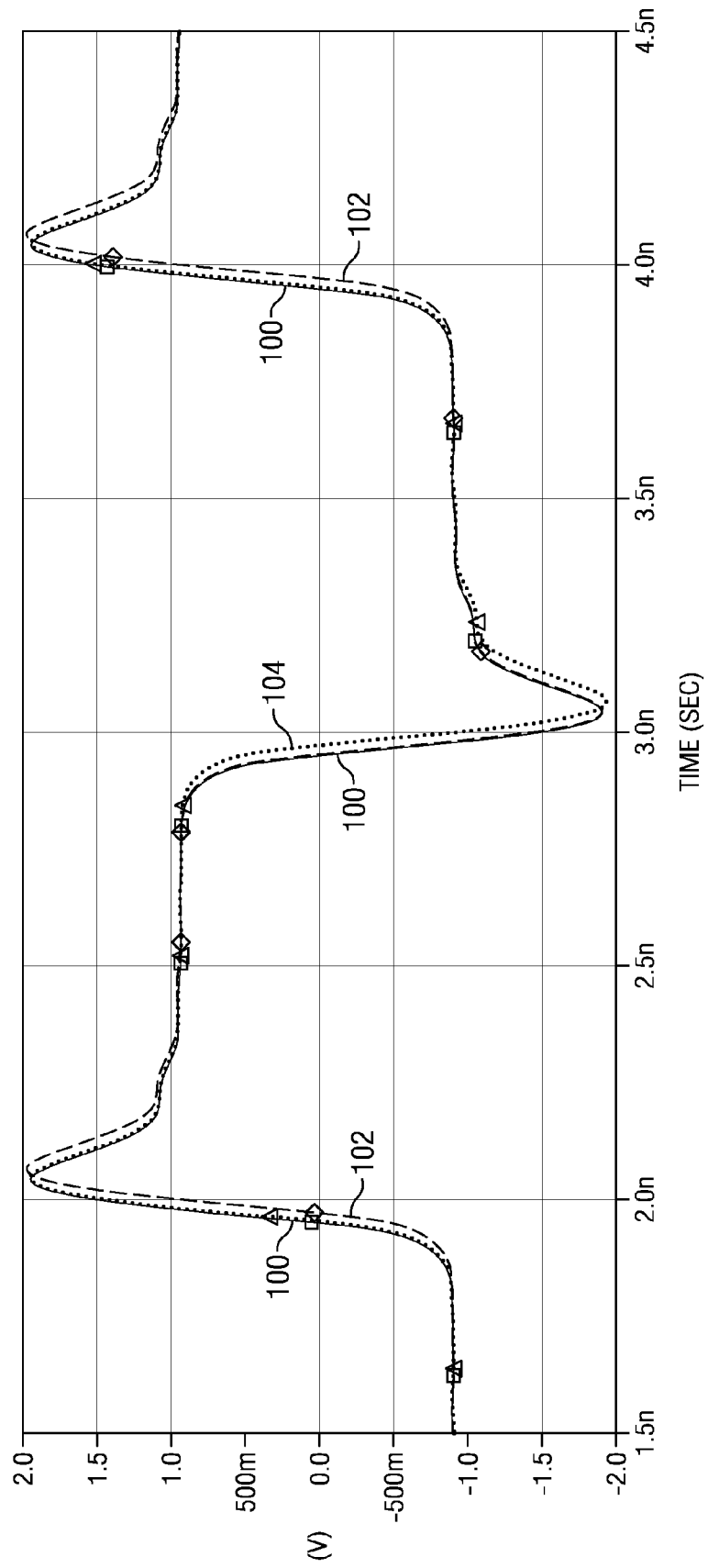
FIG. 3 is a graph of voltage vs. time, showing simulation results of the maximum plus and minus programmable duty cycle shifts produced by the circuit of FIG. 1.

FIG. 3 to which reference is now additionally made is a graph of voltage vs. time, showing results of the maximum plus and minus programmable duty cycle shifts produced by the preamplifier write data signal circuit 5 of FIG. 1. The line 100 is the output voltage baseline on lines 22 and 24, with no duty cycle shift. The line 102 shows a shift at only a negative to positive write data transition. The line 104 shows a shift at only a positive to negative write data transition.

Figure 4:
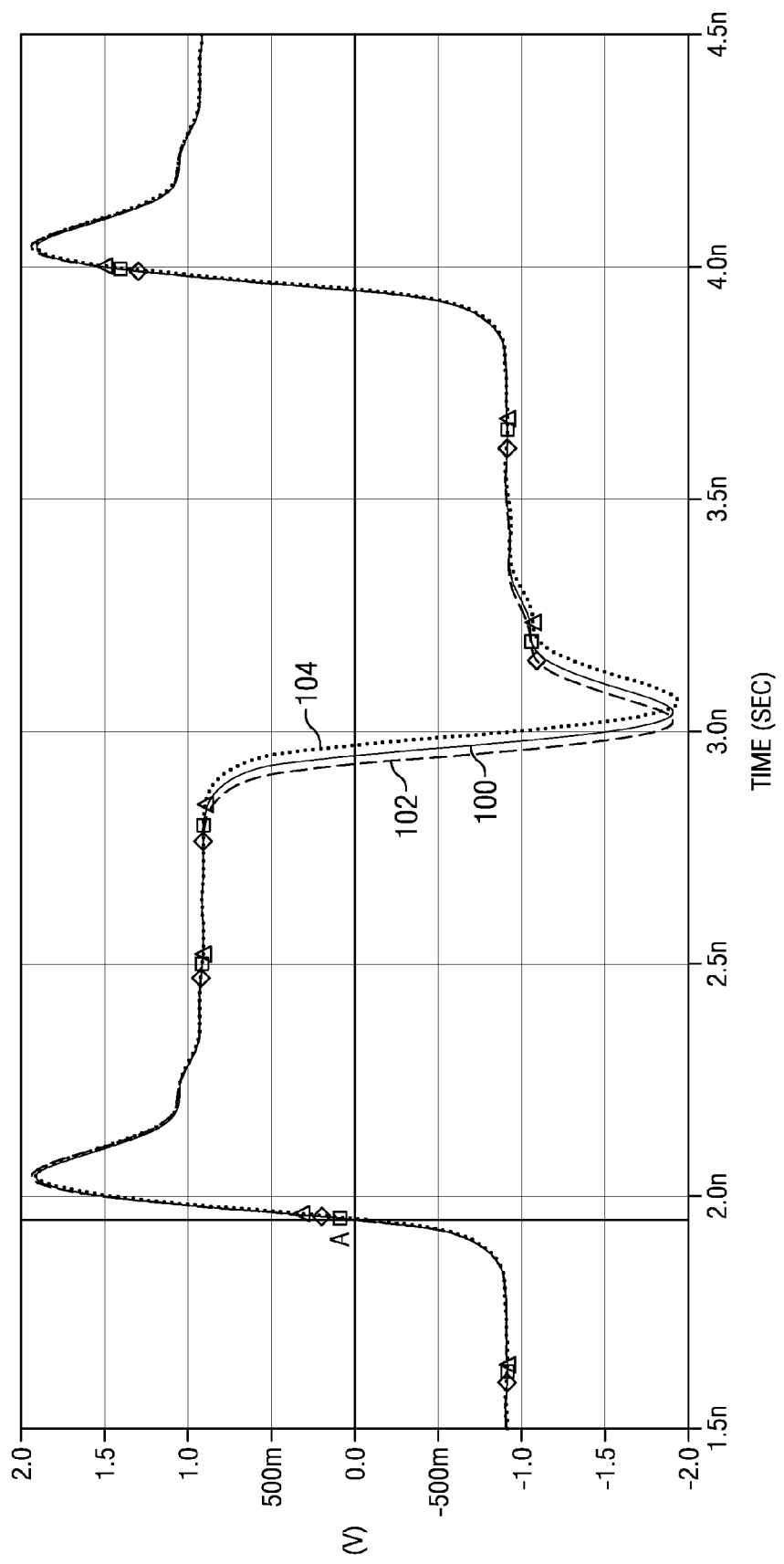
FIG. 4 is a graph of voltage vs. time, showing additional simulation results of the maximum plus and minus programmable duty cycle shifts produced by the circuit of FIG. 1, with waveforms normalized on leading edge.

FIG. 4 to which reference is now additionally made is a graph of voltage vs. time, showing additional results of the maximum plus and minus programmable duty cycle shifts produced by the preamplifier write data signal circuit 5 of FIG. 1. In Figure the waveforms in FIG. 3 were normalized on the first rising edge, waveforms generated as propagation delay in a hard disk drive write system. Now the only transition shifts are occurring on a positive to negative write data transition. Thus, line 102 is increasing the percent duty cycle of the negative transition and decreasing the percent duty cycle of the positive transition. With the roles of the programmable current sources 70 and 72 reversed, for example, by flipping the MSB (the sign bit in the serial interface described above), the line 104 is increasing the percent duty cycle of the positive transition and decreasing the percent duty cycle of the negative transition.

Figure 5:
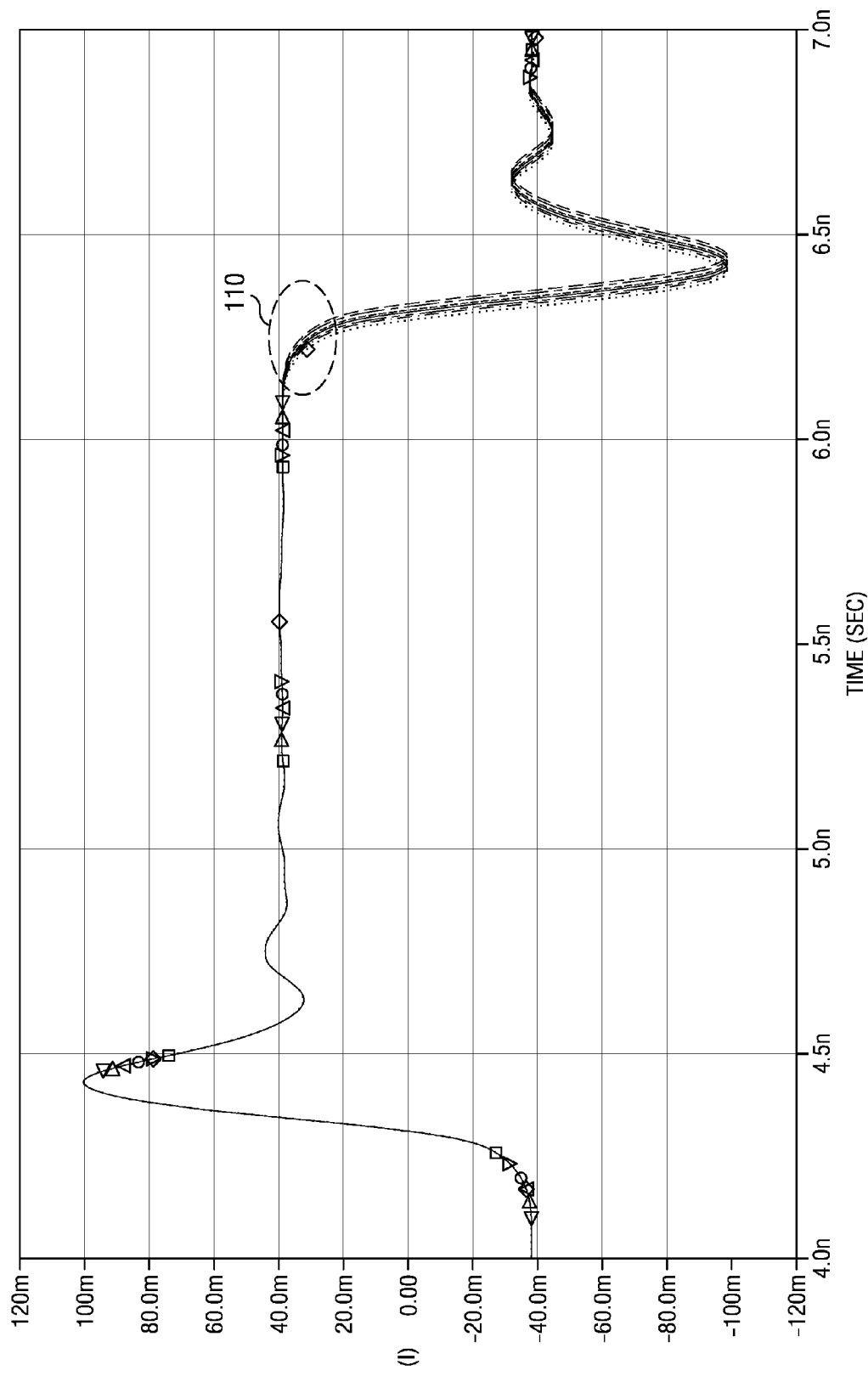
FIG. 5 is a graph of current vs. time, showing additional simulation results for various programmable options available in the circuit of FIG. 1.

FIG. 5, to which reference is now additionally made, shows all the programmable options that can be implemented with one sign bit and two magnitude bits. Of course, additional control resolution of the duty cycle shift may be achieved by increasing the number of magnitude bits.

Figure 6:
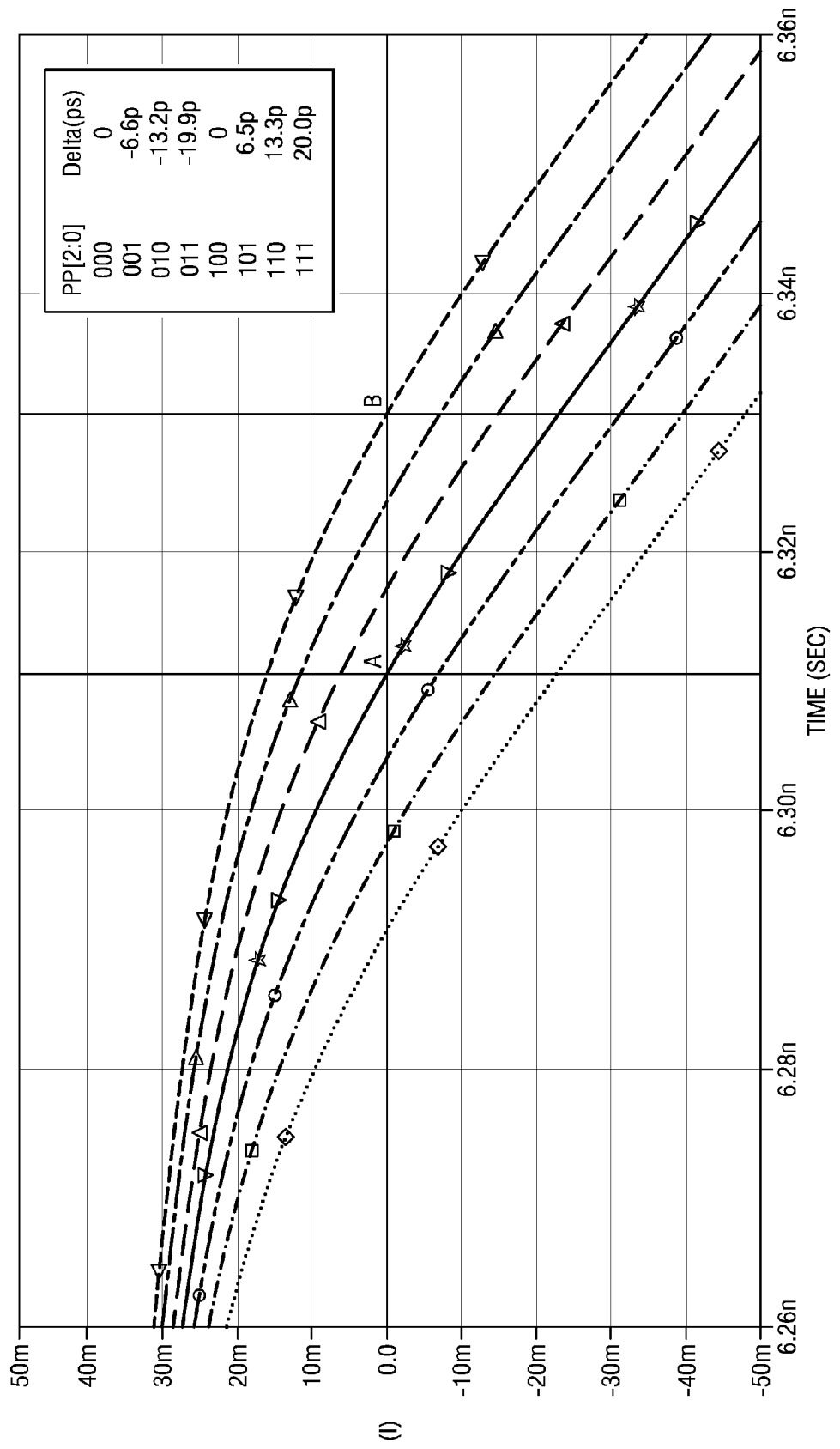
FIG. 6 is a graph of current vs. time, showing an expanded view of a portion of the graph of FIG. 5.

FIG. 6, to which reference is now additionally made, is a magnification of the curves encircled by the circle 110 in FIG. 5 show precise measurements of the duty cycle shifts achieved. Thus, it can be seen that any changes in the duty cycle of the write signal anywhere in the write channel can be corrected or compensated by appropriate programming of the programmable current sources 70 and 72 by the programmer 73. The corrections may be made, for example, in the initial manufacturing process, or dynamically by measuring the duty cycle and making constant or periodic corrections in the programmable current sources 70 and 72 to compensate for changes in the write channel, such as by changes in ambient temperature or by other factors affecting the write currents.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A circuit for providing a write current having a programmably adjustable duty cycle in a hard disk drive write channel, comprising:
    a differential pair gain circuit for receiving a data input signal and generating a differential output voltage to provide a differential write signal for generating the write current;
    and first and second programmable current sources connected to the differential pair gain circuit to create a programmable voltage offset of the differential output voltage;
    whereby the programmable voltage offset of the differential output voltage programmably adjusts the duty cycle of the write current.

2. The circuit of claim 1 wherein the differential pair gain circuit comprises resistive loads.

3. The circuit of claim 1 further comprising a programmer to selectively turn on the first and second programmable current sources.

4. The circuit of claim 3 wherein the programmer additionally selectively controls a current level provided by the first and second programmable current sources.

5. The circuit of claim 3 wherein the bipolar junction transistors are NPN transistors.

6. The circuit of claim 1 wherein the differential pair gain circuit comprises bipolar junction transistors.

7. A circuit for providing a write current having a programmably adjustable duty cycle in a hard disk drive write channel, comprising:
    an input differential pair gain circuit for receiving a data input signal and producing an input circuit differential output voltage;
    a differential pair emitter follower circuit receiving the input circuit differential output voltage and providing an emitter follower circuit differential output voltage;
    an output differential pair gain circuit receiving the emitter follower circuit differential output voltage and producing an output circuit differential output voltage for generating write head currents;
    and first and second programmable current sources connected to the input differential pair gain circuit to create a voltage offset of the input circuit differential output voltage.

8. The circuit of claim 7 wherein the input differential pair gain circuit comprises resistive loads.

9. The circuit of claim 7 wherein the differential pair emitter follower circuit and output differentia pair gain circuit each comprise resistive loads.

10. The circuit of claim 9 wherein the programmer additionally selectively controls a current level provided by the first and second programmable current sources.

11. The circuit of claim 9 wherein the bipolar junction transistors are NPN transistors.

12. The circuit of claim 7 further comprising a programmer to selectively turn on the first and second programmable current sources.

13. The circuit of claim 7 wherein the input differential pair gain circuit comprises bipolar junction transistors.

14. A write data signal circuit for a hard disk drive write head, comprising:
    an output gain stage, comprising a first differential pair of bipolar junction transistors to provide write currents to the write head;
    an emitter follower stage, comprising a second differential pair of bipolar junction transistors for providing drive signals to the output gain stage;

an input gain stage, comprising a third differential pair of bipolar junction transistors and resistive loads for the third differential pair of bipolar junction transistors for providing drive signals to the emitter follower stage;

and first and second programmable current sources respectively connected between the third differential pair of bipolar junction transistors the resistive loads whereby changes in current supplied by the first and second programmable current sources changes a duty cycle of the write currents supplied to the write head.

15. The write data signal circuit of claim 14 wherein the output gain stage comprises:

a first current path to supply write head current in one direction to the write head, the first current path including a first resistor, a first bipolar junction transistor of the first differential pair of bipolar junction transistors, and a first current source connected in series between a supply voltage and a reference potential, a first side of the write head being connected between the first resistor and the first bipolar junction transistor;

and a second current path to supply write head current in another direction to the write head, the second current path including a second resistor, a second junction bipolar transistor of the first differential pair of bipolar junction transistors, and the first current source connected in series between the supply voltage and the reference potential, a second side of the write head being connected between the second resistor and the second bipolar junction transistor.

16. The write data signal circuit of claim 15 wherein the emitter follower stage comprises:

a third current path including a third bipolar transistor of the second differential pair of bipolar junction transistors and a current source connected in series between the supply voltage and the reference potential, having an output connected between an emitter of the third bipolar transistor and a base of the second bipolar transistor;

and a fourth current path including a fourth bipolar transistor of the second differential pair of bipolar junction transistors and a current source connected in series between the supply voltage and the reference potential, having an output connected between an emitter of the fourth bipolar transistor and a base of the first bipolar transistor.

17. The write data signal circuit of claim 16 wherein the input gain stage comprises:

a fifth current path including one of the resistive loads and a fifth bipolar junction transistor of the third differential pair of bipolar junction transistors connected in series between the supply voltage and a fourth current source, a data write signal being connected to a base of the fifth bipolar transistor and an output at a collector of the fifth bipolar transistor being connected to a base of the fourth bipolar transistor;

and a sixth current path including another of the resistive loads and a sixth bipolar junction transistor of the third differential pair of bipolar junction transistors connected in series between the supply voltage and the fourth current source, a second data write signal being connected to a base of the sixth bipolar transistor and an output at a collector of the sixth bipolar transistor being connected to a base of the third bipolar transistor.

18. The write data signal circuit of claim 17 wherein the bipolar junction transistors are NPN transistors.

19. The circuit of claim 14 further comprising a programmer to selectively turn on the first and second programmable current sources.

20. The circuit of claim 19 wherein the programmer additionally selectively controls a current level provided by the first and second programmable current sources.

* * * * *